(12) United States Patent
Gao et al.

(10) Patent No.: US 11,099,226 B2
(45) Date of Patent: Aug. 24, 2021

(54) TEST CIRCUITRY AND METHOD FOR TESTING THE SAME, TEST SYSTEM

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Hongwei Gao, Beijing (CN); Guoqing Zhang, Beijing (CN); Hongxia Yang, Beijing (CN); Pucha Zhao, Beijing (CN); Xiaopeng Bai, Beijing (CN); Ke Zhao, Beijing (CN); Zhihui Jia, Beijing (CN); Yan Zong, Beijing (CN); Xiaowei Wang, Beijing (CN); Yaorong Liu, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 300 days.

(21) Appl. No.: 16/157,302

(22) Filed: Oct. 11, 2018

(65) Prior Publication Data
US 2019/0302172 A1   Oct. 3, 2019

(30) Foreign Application Priority Data
Mar. 28, 2018   (CN) .......................... 201810264950.3

(51) Int. Cl.
*G01R 31/26* (2020.01)

(52) U.S. Cl.
CPC .............................. *G01R 31/2642* (2013.01)

(58) Field of Classification Search
None
See application file for complete search history.

(56) References Cited

U.S. PATENT DOCUMENTS

| | | | |
|---|---|---|---|
| 5,532,944 A * | 7/1996 | Battista | ...................... G01T 1/17 |
| | | | 702/124 |
| 2006/0267637 A1 | 11/2006 | Umemura et al. | |

FOREIGN PATENT DOCUMENTS

| | | |
|---|---|---|
| CN | 1846141 A | 10/2006 |
| CN | 102998494 A | 3/2013 |
| CN | 103969477 A | 8/2014 |
| CN | 205945029 U | 2/2017 |
| CN | 206211953 U | 5/2017 |
| CN | 107450042 A | 12/2017 |
| CN | 206757607 U | 12/2017 |

OTHER PUBLICATIONS

First Office Action for Chinese Application No. 201810264950.3, dated Feb. 25, 2020, 8 Pages.

* cited by examiner

*Primary Examiner* — Jermele M Hollington
*Assistant Examiner* — Suresh K Rajaputra
(74) *Attorney, Agent, or Firm* — Brooks Kushman P.C.

(57) ABSTRACT

A test circuitry and a method for testing the same and a test system are provided. The test circuitry includes: a test signal input end, configured to input an initial test signal; a signal output end, configured to output a target test signal; and a signal shaping circuitry coupled to the test signal input end and the signal output end, configured to remove a noise signal from the initial test signal to obtain the target test signal.

13 Claims, 6 Drawing Sheets

TEST CIRCUITRY AND METHOD FOR TESTING THE SAME, TEST SYSTEM

CROSS-REFERENCE TO RELATED APPLICATION

This application claims priority to Chinese Patent Application No. 201810264950.3 filed on Mar. 28, 2018, which is incorporated herein by reference in its entirety.

TECHNICAL FIELD

The present disclosure relates to the field of touch technology, in particular to a test circuitry, a method for testing the same, and a test system.

BACKGROUND

The Active Matrix Organic Light Emitting Diode (AMOLED), which has a high luminance, a wide viewing angle range, and may achieve a flexible display, has been widely used in various fields. Because the inner circuit of the AMOLED is intricate, the electrical poor may occur on the AMOLED display device. For example, in the AMOLED display, volume charges in the drive transistor for driving the pixel unit cannot be released, so a characteristic warped-tail phenomenon may occur which may cause the drive transistor to have a strong leak current, which may result in a standoff abnormal of the AMOLED display device, an electrical light spots and light leakage.

In view of the above technical issue, a drive transistor aging process is commonly performed to the AMOLED display panel in the industry, so as to move the characteristic warped-tail phenomenon backward and reduce the leak current, and eliminate the electrical light spots and light leakage. However, limited by the gate scanning drive mode of the display panel, the test signal for the aging process needs to be input to the shift register unit, and the shift register unit may convert the test signal to output the resultant test signal to the display region.

However, the test signal introduced into the aging process is different from the signal in the normal display process. Generally, the test signal for aging the drive transistor has a high voltage and may be reversed. In the related art, the test signal directly output by the drive chip may be affected by the overshoot and the environment, so the test signal actually input to the product may not be the test signal in the ideal state. When such test signal is input to the product, the shift register unit of the product may be damaged, which may result in the abnormal display of the product.

SUMMARY

A test circuitry is provided in the present disclosure, including: a test signal input end, configured to input an initial test signal; a signal output end, configured to output a target test signal; and a signal shaping circuitry coupled to the test signal input end and the signal output end, configured to remove a noise signal from the initial test signal to obtain the target test signal.

Optionally, the signal output end includes a plurality of signal output ports configured to output the target test signal; the signal shaping circuitry further includes a plurality of signal shaping sub-circuitries in a one-to-one correspondence with the signal output ports, and each signal shaping sub-circuitry is coupled to the test signal input end and a corresponding signal output port; each signal shaping sub-circuitry is configured to remove the noise signal from the initial test signal to obtain the target test signal and output the target signal via the corresponding signal output port.

Optionally, the signal shaping sub-circuitry includes: a first reference signal input end configured to input a first reference signal; a first sub-circuitry, coupled to the test signal input end, the corresponding signal output port and the first reference signal input end, and configured to remove from the initial test signal the noise signal having an amplitude larger than an amplitude of the first reference signal, to obtain the target test signal.

Optionally, the first sub-circuitry includes a plurality of high-level shaping diodes coupled in series; along a conducting direction of the high-level shaping diodes, an anode of the high-level shaping diode at a first side of the first sub-circuitry is coupled to the test signal input end and the corresponding signal output port, and a cathode of the high-level shaping diode at a second side of the first sub-circuitry is coupled to the first reference signal input end.

Optionally, the signal shaping sub-circuitry further includes: a second reference signal input end configured to input a second reference signal; a second sub-circuitry, coupled to the test signal input end, the corresponding signal output port and the second reference signal input end, and configured to remove from the initial test signal the noise signal having an amplitude smaller than an amplitude of the second reference signal, to obtain the target test signal.

Optionally, the second sub-circuitry includes a plurality of low-level shaping diodes coupled in series; along a conducting direction of the low-level shaping diodes, an anode of the low-level shaping diode at a first side of the second sub-circuitry is coupled to second reference signal input end, and a cathode of the low-level shaping diode at a second side of the second sub-circuitry is coupled to the test signal input end and the corresponding signal output port.

Optionally, the high-level shaping diodes and the low-level shaping diodes are high-frequency diodes.

Optionally, the first reference signal input end and the second reference signal input end are coupled to a reference signal drive circuitry.

A method for testing the test circuitry is further provided in the present disclosure, including: receiving an initial test signal input by a test signal input end; removing, by a signal shaping circuitry, a noise signal from the initial test signal, to obtain the target test signal; and outputting the target test signal by a signal output end.

Optionally, the signal output end includes a plurality of signal output ports; the signal shaping circuitry further includes a plurality of signal shaping sub-circuitries in a one-to-one correspondence with the signal output ports, and each signal shaping sub-circuitry is coupled to the test signal input end and a corresponding signal output port; where the removing, by the signal shaping circuitry, the noise signal from the initial test signal, to obtain the target test signal further includes: removing, by the signal shaping sub-circuitry, the noise signal from the initial test signal, to obtain the target test signal; where the outputting the target test signal by the signal output end further includes: outputting the target test signal via the signal output port corresponding to the signal shaping sub-circuitry.

Optionally, the signal shaping sub-circuitry further includes: a first reference signal input end configured to input a first reference signal; a first sub-circuitry, coupled to the test signal input end, the corresponding signal output port and the first reference signal input end; where the removing, by the signal shaping circuitry, the noise signal from the initial test signal, to obtain the target test signal further includes: removing, by the first sub-circuitry, from the initial test signal the noise signal having an amplitude larger than an amplitude of the first reference signal, to obtain the target test signal.

Optionally, the signal shaping sub-circuitry further includes: a second reference signal input end configured to input a second reference signal; a second sub-circuitry, coupled to the test signal input end, the corresponding signal output port and the second reference signal input end; where the removing, by the signal shaping circuitry, the noise signal from the initial test signal, to obtain the target test signal further includes: removing, by the second sub-circuitry, from the initial test signal the noise signal having an amplitude smaller than an amplitude of the second reference signal, to obtain the target test signal.

A test system is further provided in the present disclosure, including the above test circuitry, where the signal output end of the test circuitry is configured to output a target test signal to a product to be tested.

BRIEF DESCRIPTION OF THE DRAWINGS

The present disclosure will be described hereinafter in conjunction with the drawings. The following drawings are for illustrative purposes only, but shall not be used to limit the scope of the present disclosure.

DETAILED DESCRIPTION

The present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the related art, during a manufacturing process of a OLED display device, in the OLED display, volume charges in the drive transistor for driving the pixel unit to emit light cannot be released, so a characteristic warped-tail phenomenon may occur which may cause the drive transistor to have a strong leak current, which may result in a standoff abnormal of the OLED display device, an electrical light spots and light leakage.

In view of this, the drive transistor is commonly aged through an aging process, so as to move the characteristic warped-tail phenomenon backward and reduce the leak current. Such aging process mainly includes applying a high-bias test signal to the product, and an ideal high-bias test signal may enable the aging process to be performed smoothly without adversely affecting the product to be aged, while an abnormal high-bias test signal may adversely affect the product to be aged, which may cause a display abnormal. Therefore, it is required to input the test signal which meets the requirement and has a high accuracy to the product during the aging process.

In the related art, a drive chip is commonly used to provide a test signal to the product to be aged. However, the overshoot of the test signal provided by the drive chip is inevitable and the test signal may be affected by the environment, so the test signal input to the product to be aged may also carry a noise signal. As a result, the test signal may not be ideal.

Figure 1:
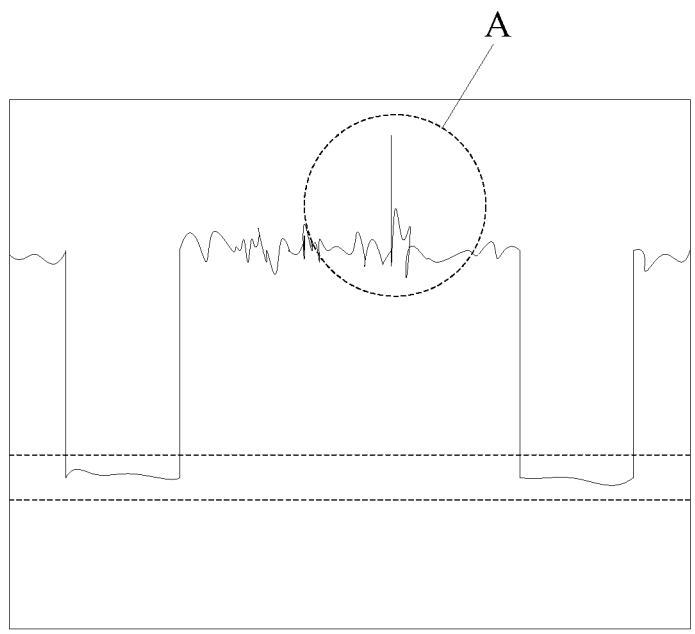
FIG. 1 is a schematic view showing a wave form of a test signal affected by the environment displayed on an oscilloscope in some embodiments of the present disclosure.
Figure 2:
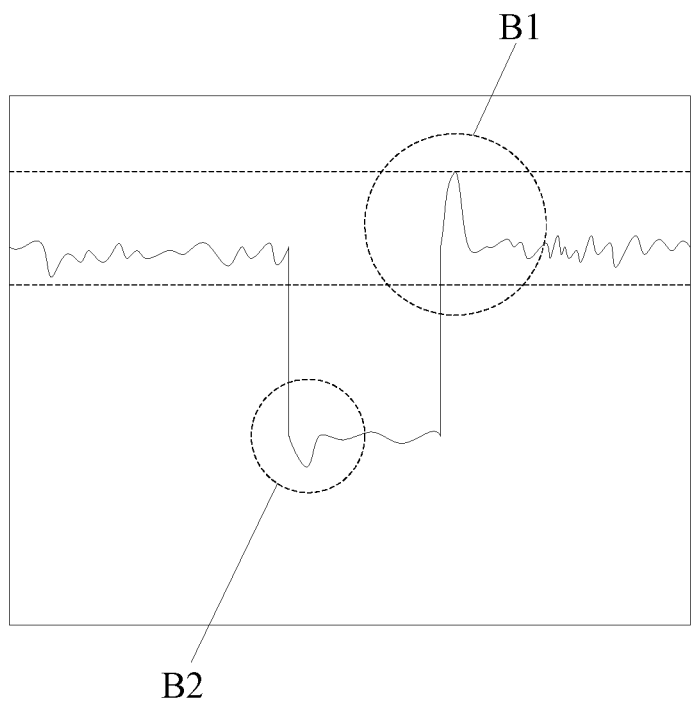
FIG. 2 is a schematic view showing a wave form of a test signal affected by the overshoot displayed on an oscilloscope in some embodiments of the present disclosure.

Referring to FIG. 1 which is a schematic view showing a wave form of a test signal affected by the environment displayed on an oscilloscope in some embodiments of the present disclosure. The portion A of FIG. 1 shows the noise signal in the test signal affected by the environment, and the product may be adversely affected when such test signal is used to age the product. Referring to FIG. 2 which is a schematic view showing a wave form of a test signal affected by the overshoot displayed on an oscilloscope in some embodiments of the present disclosure. The portions B1 and B2 show the abnormality of the test signal due to the overshoot, where the test signal carries the noise signal, and the product may also be adversely affected when such test signal is used to age the product.

In view of this, a signal shaping circuitry may be introduced to the input end of the test signal, so that the test signal may be ideal after being shaped.

Figure 3:
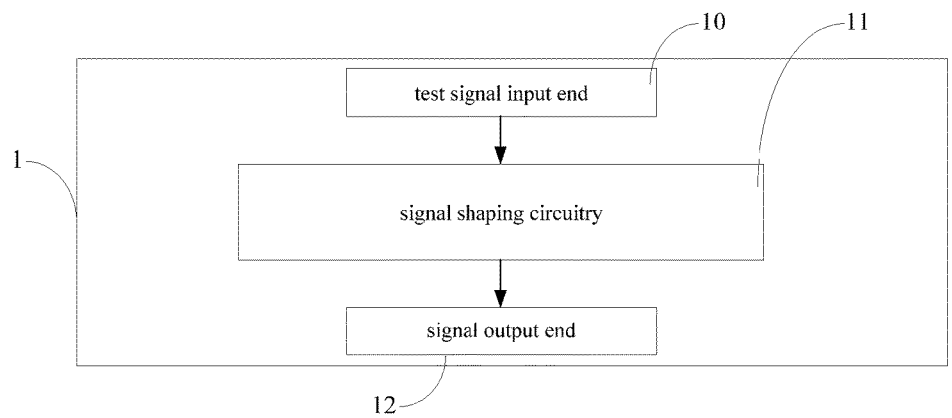
FIG. 3 is a schematic view of a test circuitry in some embodiments of the present disclosure.

As shown in FIG. 3, a test circuitry 1 is provided in some embodiments of the present disclosure, including: a test signal input end 10, configured to input an initial test signal; a signal output end 12, configured to output a target test signal; and a signal shaping circuitry 11 coupled to the test signal input end 10 and the signal output end 12, configured to remove a noise signal from the initial test signal to obtain the target test signal and output the target test signal via the signal output end 12.

To be specific, during an actual operation of the above test circuitry 1, the test signal input end 10 inputs an initial test signal, and then the signal shaping circuitry 11 shapes the initial test signal, so as to remove a noise signal from the initial test signal to obtain the target test signal. Then, the target test signal is output via the signal output end 12 to the produce to be aged. It should be noted that, the test signal input end 10 may be coupled to the test signal drive circuitry, and the test signal drive circuitry may provide the initial test signal to the test signal input end 10. The noise signal in the initial test signal may be caused by the environment or the overshoot.

According to the test circuitry in some embodiments of the present disclosure, the test circuitry 1 includes the test signal input end 10, the signal shaping circuitry 11 and the signal output end 12, when the test signal is output to the product to be aged, the signal shaping circuitry 11 may shape the initial test signal input by the test signal input end 10, so as to obtain the target test signal without the noise signal, and then the target test signal may be output to the product to be aged via the signal output end 12. Therefore, the noise signal may be removed from the initial test signal, so the target test signal output to the product to be aged may be an ideal target test signal, thereby solving the technical issue in the related art that the test circuitry cannot provide an ideal test signal and the product to be tested may become abnormal.

Figure 4:
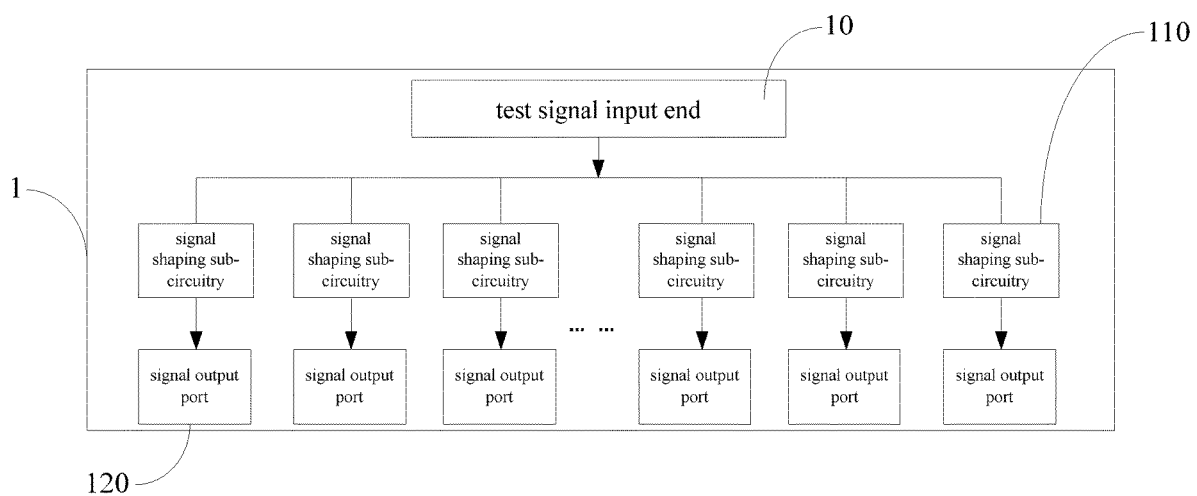
FIG. 4 is a schematic view of a test circuitry in some embodiments of the present disclosure.

As shown in FIG. 4, the signal output end 12 in some embodiments of the present disclosure includes N signal output ports 120 configured to output the target test signal. The signal shaping circuitry 11 further includes N signal shaping sub-circuitries 110 in a one-to-one correspondence with the signal output ports 120, and each signal shaping sub-circuitry 110 is coupled to the test signal input end 10 and the corresponding signal output port 120. The signal shaping sub-circuitry 110 is configured to remove the noise signal from the initial test signal to obtain the target test signal and output the target signal via the signal output port 120 corresponding to the signal shaping sub-circuitry 110, where N is an integer larger than or equal to 1.

To be specific, in the case that the signal output end 12 includes N signal output ports 120 and the signal shaping circuitry 11 includes N signal shaping sub-circuitries 110, the working process of the test circuitry 1 includes: the test signal input end 10 inputs an initial test signal, the N signal shaping sub-circuitries 110 shape the received initial test signal, so as to remove a noise signal from the initial test signal to obtain N target test signals and then output the N target signals via the N corresponding signal output ports 120 to N products to be aged.

Figure 5:
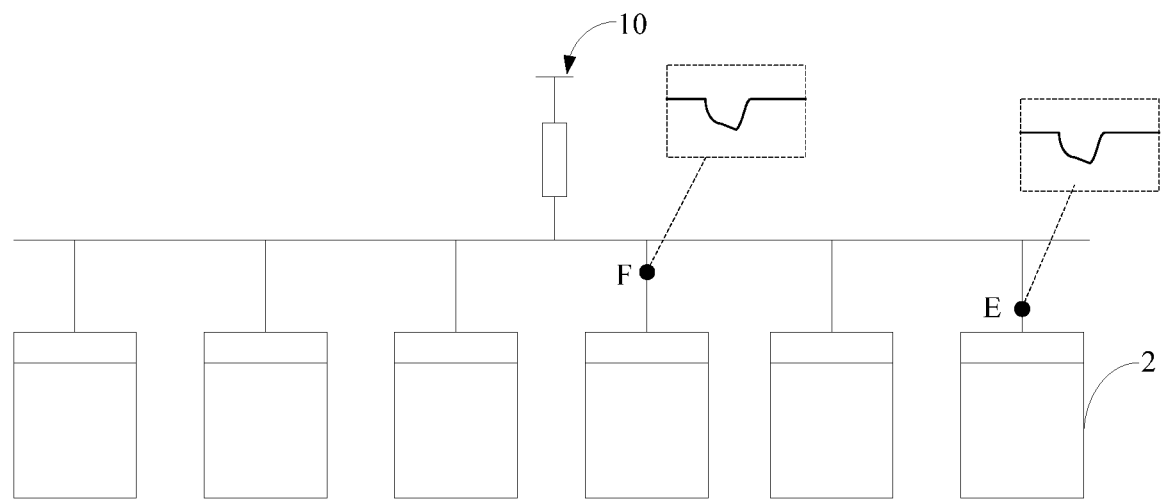
FIG. 5 is a schematic view showing a first waveform of test signals in different branches in the case that a product to be aged is abnormal in some embodiments of the present disclosure.

To be specific, during an actual manufacturing process, in order to improve the productivity, it is able to use one test circuitry to perform simultaneously the aging tests on a plurality of products to be aged. However, when one of the products to be aged is abnormal, the test signals input to other products to be aged may be adversely affected and the other products may be defective. Referring to FIG. 5, when the product 2 corresponding to point E is abnormal, the test signal at the point E may be adversely affected, and the waveform of the test signal may be distorted. Because the point E is coupled to the point F, the test signal at the point F may be adversely affected accordingly.

Figure 6:
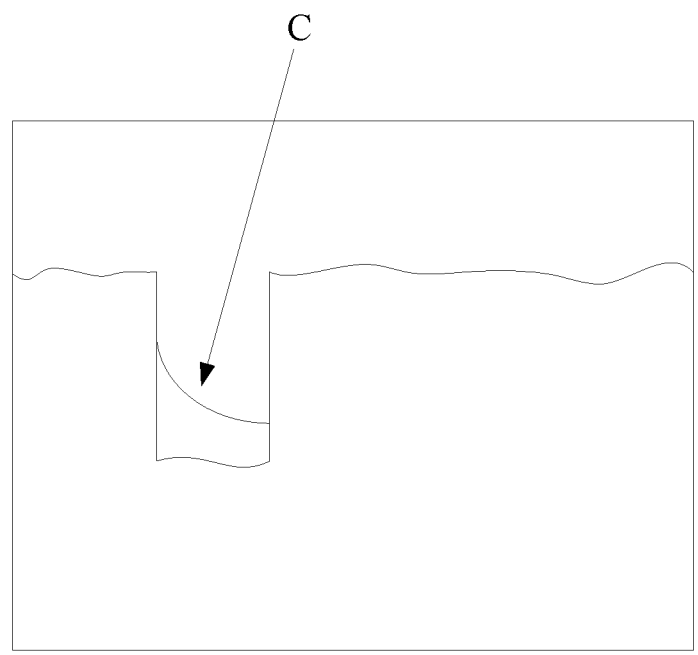
FIG. 6 is a schematic view showing a first waveform of a test signal interfered by other products to be aged in some embodiments of the present disclosure.
Figure 7:
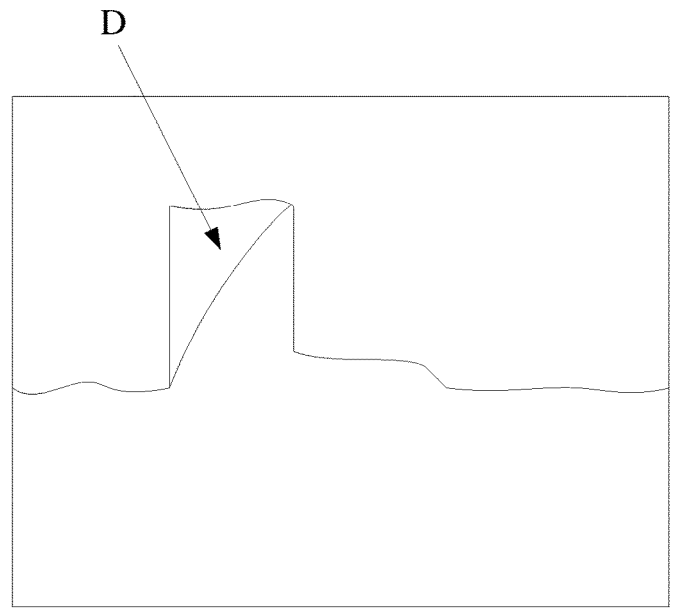
FIG. 7 is a schematic view showing a second waveform of a test signal interfered by other products to be aged in some embodiments of the present disclosure.

As a result, the test signal input to the product to be aged corresponding to the point F may carry the noise signal, so the waveform of the test signal may also be distorted seriously. FIG. 6 and FIG. 7 show the waveforms of test signals interfered by other products to be aged, where the portions C and D are noise signals cause by interference.

Figure 8:
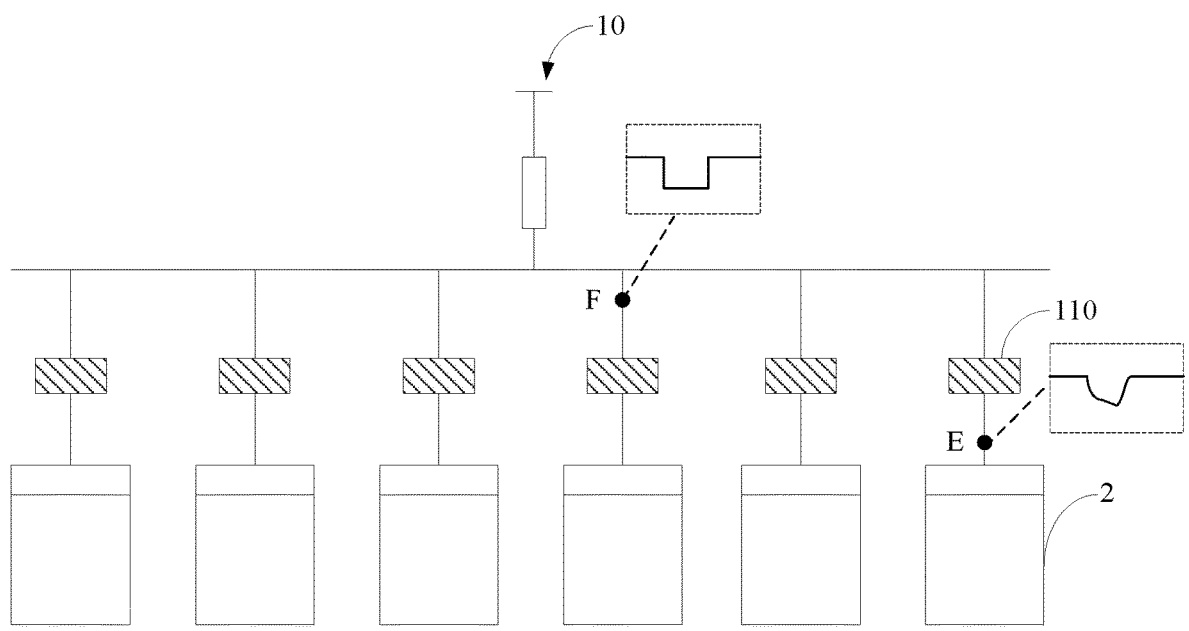
FIG. 8 is a schematic view showing a second waveform of test signals in different branches in the case that a product to be aged is abnormal in some embodiments of the present disclosure.

In view of this, as shown in FIG. 4, each signal output port 120 is provided with a signal shaping sub-circuitry 110, so as to shape the test signals output to all the products to be aged and avoid the mutual interference of the test signals output to different products to be aged. As shown in FIG. 8, when the product 2 corresponding to the point E' is abnormal and the test signal at the point E' is abnormal, due to the signal shaping sub-circuitry 110 between the point E' and point F', the test signal at the point F' may not be adversely affected by the point E'. Therefore, the product corresponding to the point F' may receive an ideal target test signal.

According to the test circuitry in the embodiments, the signal shaping circuitry 11 includes N signal shaping sub-circuitries 110 coupled to the test signal input end 10, and the signal output end 12 includes N signal output ports 120 in a one-to-one correspondence with N signal shaping sub-circuitries 110. Therefore, it is able to use one test circuitry 1 to perform simultaneously the aging tests on N products to be aged, thereby improving the productivity, avoiding the mutual interference among different products to be aged, ensuring that the test signal output to each product to be aged is an ideal target test signal, further improving the aging yield of the product.

It should be noted that, in some embodiments of the present disclosure, it is able to arrange a resistor chain of 0 Ohm between the test signal input end 10 and the signal shaping circuitry 11, so as to detect the waveform of the test signal of the test circuitry.

Figure 9:
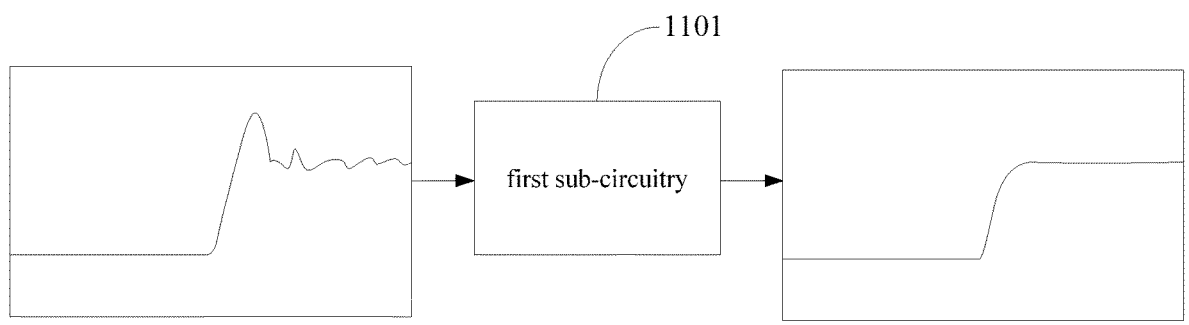
FIG. 9 is a schematic view showing waveforms of a test signal prior to and subsequent to a shaping process of a first sub-circuitry.
Figure 11:
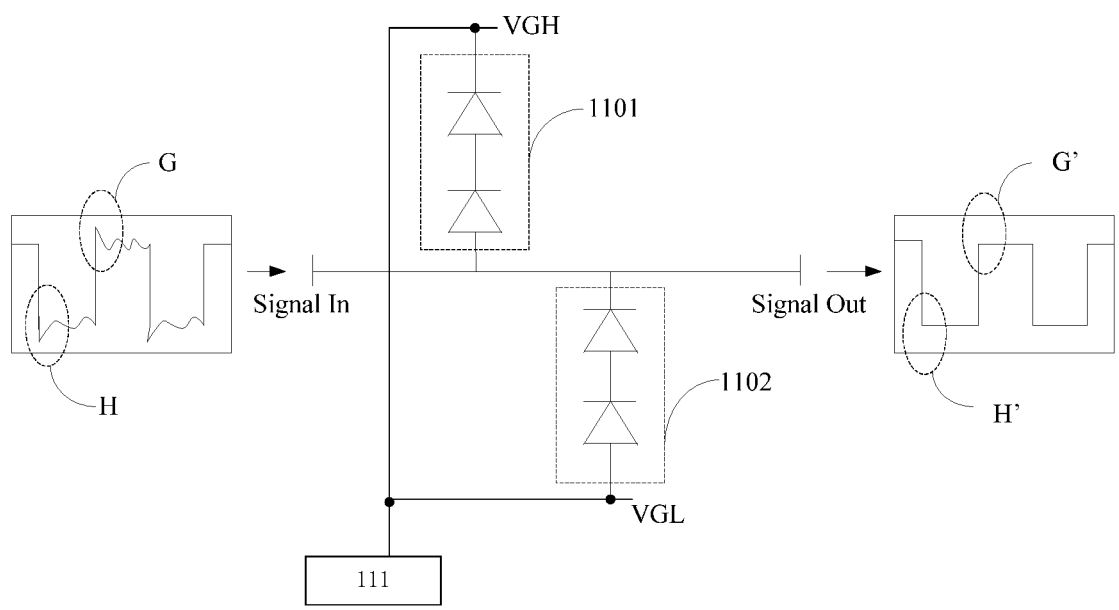
FIG. 11 is a schematic view showing waveforms of a test signal prior to and subsequent to shaping processes of a first sub-circuitry and a second sub-circuitry.

In some embodiments of the present disclosure, referring to FIG. 9 and FIG. 11, the signal shaping sub-circuitry 110 includes a first reference signal input end VGH and a first sub-circuitry 1101. The first reference signal input end VGH is configured to input a first reference signal. The first sub-circuitry 1101 is coupled to the test signal input end 10 (Signal In), the corresponding signal output port 120 (Signal Out) and the first reference signal input end VGH. The first sub-circuitry 1101 is configured to remove from the initial test signal the noise signal having an amplitude larger than an amplitude of the first reference signal, to obtain the target test signal.

To be specific, the first sub-circuitry 1101 of the signal shaping sub-circuitry 110 is coupled to the test signal input end 10, the corresponding signal output port 120 and the first reference signal input end VGH. When the initial test signal input by the test signal input end 10 is transmitted to the signal shaping sub-circuitry 110, the first sub-circuitry 1101 of the signal shaping sub-circuitry 110 may remove from the initial test signal the noise signal having an amplitude larger than an amplitude of the first reference signal to obtain the target test signal, and output, via corresponding the signal output port 120, the target test signal to the corresponding product to be aged.

Figure 10:
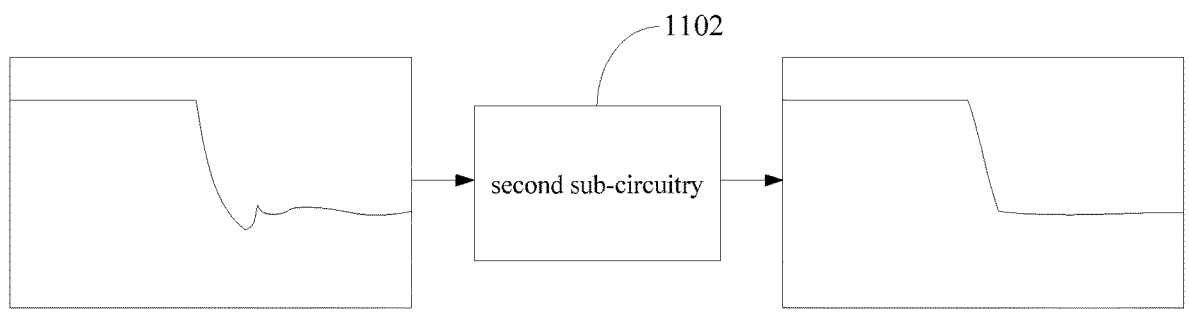
FIG. 10 is a schematic view showing waveforms of a test signal prior to and subsequent to a shaping process of a second sub-circuitry.

In some embodiments of the present disclosure, referring to FIG. 10 and FIG. 11, the signal shaping sub-circuitry 110 further includes a second reference signal input end VGL and a second sub-circuitry 1102. The second reference signal input end VGL is configured to input a second reference signal. The second sub-circuitry 1102 is coupled to the test signal input end 10, the corresponding signal output port 120 and the second reference signal input end VGL. The second sub-circuitry 1102 is configured to remove from the initial test signal the noise signal having an amplitude smaller than an amplitude of the second reference signal, to obtain the target test signal.

To be specific, the second sub-circuitry 1102 of the signal shaping sub-circuitry 110 is coupled to the test signal input end 10, the corresponding signal output port 120 and the second reference signal input end VGL. When the initial test signal input by the test signal input end 10 is transmitted to the signal shaping sub-circuitry 110, the second sub-circuitry 1102 of the signal shaping sub-circuitry 110 may remove from the initial test signal the noise signal having an amplitude smaller than an amplitude of the second reference signal to obtain the target test signal, and output, via corresponding the signal output port 120, the target test signal to the corresponding product to be aged.

According to the test circuitry in the embodiments, the signal shaping sub-circuitry 110 includes the first sub-circuitry 1101 and the second sub-circuitry 1102. When shaping the initial test signal by the signal shaping sub-circuitry 110, the first sub-circuitry 1101 is able to remove from the initial test signal the noise signal having an amplitude larger than an amplitude of the first reference signal, and the second sub-circuitry 1102 is able to remove from the initial test signal the noise signal having an amplitude smaller than an amplitude of the second reference signal, so the target test signal shaped by the signal shaping sub-circuitry 110 may be an ideal test signal, thereby solving the technical issue in the related art that the test circuitry cannot provide an ideal test signal and the product to be tested may become abnormal.

It should be noted that, the first reference signal input end VGH and the second reference signal input end VGL may both be coupled to a reference signal drive circuitry 111, and the reference signal drive circuitry 111 may provide the first reference signal to the first reference signal input end VGH, and provide the second reference signal to the second reference signal input end VGL. In addition, the first and the second reference signals may be DC signals and correspond to a maximum voltage and minimum voltage for rectification respectively. Level values of the first and the second reference signals may be set based on the high and low level values of the required test signal. Therefore, the high level value of the target test signal is smaller than or equal to the level value of the first reference signal, and the low level value of the target test signal is larger than or equal to the level value of the second reference signal, so the target test signal may be an ideal test signal.

The signal shaping sub-circuitry in some embodiments of the present disclosure may have various structures, of which the structure will be described in details in the followings.

In some embodiments of the present disclosure, referring to FIG. 11, the first sub-circuitry 1101 includes a plurality of high-level shaping diodes coupled in series, and along a conducting direction of the high-level shaping diodes, an anode of the first high-level shaping diode is coupled to the test signal input end 10 (Signal In) and the corresponding signal output port 120 (Signal Out), and a cathode of the last high-level shaping diode is coupled to the first reference signal input end.

To be specific, when the anode of the first high-level shaping diode of the first sub-circuitry 1101 receives the initial test signal input by the test signal input end 10 and the test signal carries the noise signal of which the amplitude is larger than that of the first reference signal, the high-level shaping diodes of the first sub-circuitry 1101 may be turned on due to a forward bias, to enable the redundant charges corresponding to the noise signal of which the amplitude is larger than that of the first reference signal to flow out via the high-level shaping diodes, so the waveform of the test signal processed by the first sub-circuitry 1101 may become ideal (as shown in portions G to G' in FIG. 11).

In some embodiments of the present disclosure, referring to FIG. 11, the second sub-circuitry 1102 includes a plurality of low-level shaping diodes coupled in series, and along a conducting direction of the low-level shaping diodes, an anode of the first low-level shaping diode is coupled to second reference signal input end, and a cathode of the last low-level shaping diode is coupled to the test signal input end 10 (Signal In) and the corresponding signal output port 120 (Signal Out).

To be specific, when the cathode of the last low-level shaping diode of the second sub-circuitry 1102 receives the initial test signal input by the test signal input end 10 and the test signal carries the noise signal of which the amplitude is smaller than that of the second reference signal, the low-level shaping diodes of the second sub-circuitry 1102 may be turned on due to a forward bias, to enable the redundant charges corresponding to the noise signal of which the amplitude is smaller than that of the second reference signal to flow out via the low-level shaping diodes, so the waveform of the test signal processed by the second sub-circuitry 1102 may become ideal (as shown in portions H to H' in FIG. 11).

According to the test circuitry in the embodiments, the first sub-circuitry 1101 includes a plurality of high-level shaping diodes coupled in series, and the second sub-circuitry 1102 includes a plurality of low-level shaping diodes coupled in series, so as to remove the noise signal from the initial test signal to obtain the target test signal. The first sub-circuitry 1101 and the second sub-circuitry 1102 do not have a power-maintaining component, when shaping the initial test signal by the first sub-circuitry 1101 and the second sub-circuitry 1102, a time sequence of the output target test signal may not be affected, thereby avoiding the time delay. Therefore, when the test circuitry 1 is used to provide the test signal to the product to be aged, the provided test signal may be ideal and the initial test signal may be shaped without the time delay, thereby ensuring the accuracy of the target test signal output to the product to be aged.

In some embodiments of the present disclosure, the high-level shaping diodes and the low-level shaping diodes are high-frequency diodes.

To be specific, because the high-frequency diode may make a response quickly, so the signal shaping sub-circuitry 110 formed by the high-level shaping diodes in the first sub-circuitry 1101 and the low-level shaping diodes in the second sub-circuitry 1102 may make a response quickly when shaping the high-frequency test signal, thereby better removing the noise signal from the initial test signal. It should be noted that, there are various high-frequency diodes, such as super-fast recovery diode which may work in the circuit with a frequency larger than 20 KHz.

A method for testing the test circuitry is further provided in some embodiments of the present disclosure, applied to the above test circuitry and including: receiving an initial test signal input by a test signal input end 10.

To be specific, the test signal input end 10 is coupled to the test signal drive circuitry, and the test signal drive circuitry provides the initial test signal to the test signal input end 10.

The method further includes: removing, by a signal shaping circuitry 11, a noise signal from the initial test signal, to obtain the target test signal; and outputting the target test signal by a signal output end 12.

To be specific, after the initial test signal input by the test signal input end 10 is received, and then the signal shaping circuitry 11 shapes the initial test signal, so as to remove a noise signal from the initial test signal to obtain the target test signal. Then, the target test signal is output via the signal output end 12 to the produce to be aged.

According to the method for testing the test circuitry in some embodiments of the present disclosure, the signal shaping circuitry 11 may shape the initial test signal input by the test signal input end 10, so as to obtain the target test signal without the noise signal, and then the target test signal may be output to the product to be aged via the signal output end 12. Therefore, the noise signal may be removed from the initial test signal, so the target test signal output to the product to be aged may be an ideal target test signal, thereby solving the technical issue in the related art that the test circuitry cannot provide an ideal test signal and the product to be tested may become abnormal.

In some embodiments of the present disclosure, the signal output end 12 includes N signal output ports 120 configured to output the target test signal. The signal shaping circuitry 11 further includes N signal shaping sub-circuitries 110 in a one-to-one correspondence with the signal output ports 120, and each signal shaping sub-circuitry 110 is coupled to the test signal input end 10 and the corresponding signal output port 120.

In some embodiments of the present disclosure, the removing, by the signal shaping circuitry 11, the noise signal from the initial test signal, to obtain the target test signal further includes: removing, by the signal shaping sub-circuitry 10, the noise signal from the initial test signal, to obtain the target test signal.

In some embodiments of the present disclosure, the outputting the target test signal by the signal output end 12 further includes: outputting the target test signal via the signal output port 120 corresponding to the signal shaping sub-circuitry 110.

According to the method for testing the test circuitry in some embodiments of the present disclosure, it is able to use one test circuitry to perform simultaneously the aging tests on N products to be aged, thereby improving the productivity, avoiding the mutual interference among different products to be aged, ensuring that the test signal output to each product to be aged is an ideal target test signal, further improving the aging yield of the product.

In some embodiments of the present disclosure, the signal shaping sub-circuitry 110 includes a first reference signal input end VGH and a first sub-circuitry 1101. The first reference signal input end VGH is configured to input a first reference signal. The first sub-circuitry 1101 is coupled to the test signal input end 10 (Signal In), the corresponding signal output port 120 (Signal Out) and the first reference signal input end VGH.

In some embodiments of the present disclosure, the removing, by the signal shaping circuitry 110, the noise signal from the initial test signal, to obtain the target test signal further includes: removing, by the first sub-circuitry 1101, from the initial test signal the noise signal having an amplitude larger than an amplitude of the first reference signal, to obtain the target test signal.

In some embodiments of the present disclosure, the signal shaping sub-circuitry 110 further includes a second reference signal input end VGL and a second sub-circuitry 1102. The second reference signal input end VGL is configured to input a second reference signal. The second sub-circuitry 1102 is coupled to the test signal input end 10, the corresponding signal output port 120 and the second reference signal input end VGL.

In some embodiments of the present disclosure, the removing, by the signal shaping circuitry 110, the noise signal from the initial test signal, to obtain the target test signal further includes: removing, by the second sub-circuitry 1102, from the initial test signal the noise signal having an amplitude smaller than an amplitude of the second reference signal, to obtain the target test signal.

According to the method for testing the test circuitry in some embodiments of the present disclosure, when shaping the initial test signal by the signal shaping sub-circuitry 110, the first sub-circuitry 1101 is able to remove from the initial test signal the noise signal having an amplitude larger than an amplitude of the first reference signal, and the second sub-circuitry 1102 is able to remove from the initial test signal the noise signal having an amplitude smaller than an amplitude of the second reference signal, so the target test signal shaped by the signal shaping sub-circuitry 110 may be an ideal test signal, thereby solving the technical issue in the related art that the test circuitry cannot provide an ideal test signal and the product to be tested may become abnormal.

A test system is further provided in some embodiments of the present disclosure, including the above test circuitry, where the signal output end 12 of the test circuitry is configured to output a target test signal to a product to be tested.

According to the test system in some embodiments of the present disclosure, when shaping the initial test signal by the signal shaping sub-circuitry 110, the first sub-circuitry 1101 is able to remove from the initial test signal the noise signal having an amplitude larger than an amplitude of the first reference signal, and the second sub-circuitry 1102 is able to remove from the initial test signal the noise signal having an amplitude smaller than an amplitude of the second reference signal, so the target test signal shaped by the signal shaping sub-circuitry 110 may be an ideal test signal, thereby solving the technical issue in the related art that the test circuitry cannot provide an ideal test signal and the product to be tested may become abnormal.

The above are merely some embodiments of the present disclosure. A person skilled in the art may make further modifications and improvements without departing from the principle of the present disclosure, and these modifications and improvements shall also fall within the scope of the present disclosure.

What is claimed is:

1. A test circuitry, comprising:
 a test signal input end, configured to input an initial test signal;
 a signal output end, configured to output a target test signal; and
 a signal shaping circuitry coupled to the test signal input end and the signal output end, configured to remove a noise signal from the initial test signal to obtain the target test signal;
 wherein the signal output end comprises a plurality of signal output ports configured to output the target test signal;
 the signal shaping circuitry further comprises a plurality of signal shaping sub-circuitries in a one-to-one correspondence with the signal output ports, and each signal shaping sub-circuitry is coupled to the test signal input end and a corresponding signal output port.

2. The test circuitry according to claim 1, wherein
 each signal shaping sub-circuitry is configured to remove the noise signal from the initial test signal to obtain the target test signal and output the target signal via the corresponding signal output port.

3. The test circuitry according to claim 2, wherein the signal shaping sub-circuitry comprises:
 a first reference signal input end configured to input a first reference signal;
 a first sub-circuitry, coupled to the test signal input end, the corresponding signal output port and the first reference signal input end, and configured to remove from the initial test signal the noise signal having an amplitude larger than an amplitude of the first reference signal, to obtain the target test signal.

4. The test circuitry according to claim 3, wherein the first sub-circuitry comprises a plurality of high-level shaping diodes coupled in series;

along a conducting direction of the high-level shaping diodes, an anode of the high-level shaping diode at a first side of the first sub-circuitry is coupled to the test signal input end and the corresponding signal output port, and a cathode of the high-level shaping diode at a second side of the first sub-circuitry is coupled to the first reference signal input end.

5. The test circuitry according to claim 4, wherein the signal shaping sub-circuitry further comprises:

a second reference signal input end configured to input a second reference signal;

a second sub-circuitry, coupled to the test signal input end, the corresponding signal output port and the second reference signal input end, and configured to remove from the initial test signal the noise signal having an amplitude smaller than an amplitude of the second reference signal, to obtain the target test signal.

6. The test circuitry according to claim 5, wherein the second sub-circuitry comprises a plurality of low-level shaping diodes coupled in series;

along a conducting direction of the low-level shaping diodes, an anode of the low-level shaping diode at a first side of the second sub-circuitry is coupled to second reference signal input end, and a cathode of the low-level shaping diode at a second side of the second sub-circuitry is coupled to the test signal input end and the corresponding signal output port.

7. The test circuitry according to claim 6, wherein the high-level shaping diodes and the low-level shaping diodes are high-frequency diodes.

8. The test circuitry according to claim 6, wherein the first reference signal input end and the second reference signal input end are coupled to a reference signal drive circuitry.

9. A method for testing the test circuitry according to claim 1, comprising:

receiving an initial test signal input by a test signal input end;

removing, by a signal shaping circuitry, a noise signal from the initial test signal, to obtain the target test signal; and outputting the target test signal by a signal output end.

10. The method according to claim 9, wherein the signal output end comprises a plurality of signal output ports;

the signal shaping circuitry further comprises a plurality of signal shaping sub-circuitries in a one-to-one correspondence with the signal output ports, and each signal shaping sub-circuitry is coupled to the test signal input end and a corresponding signal output port;

wherein the removing, by the signal shaping circuitry, the noise signal from the initial test signal, to obtain the target test signal further comprises:

removing, by the signal shaping sub-circuitry, the noise signal from the initial test signal, to obtain the target test signal;

wherein the outputting the target test signal by the signal output end further comprises: outputting the target test signal via the signal output port corresponding to the signal shaping sub-circuitry.

11. The method according to claim 10, wherein the signal shaping sub-circuitry further comprises:

a first reference signal input end configured to input a first reference signal;

a first sub-circuitry, coupled to the test signal input end, the corresponding signal output port and the first reference signal input end;

wherein the removing, by the signal shaping circuitry, the noise signal from the initial test signal, to obtain the target test signal further comprises:

removing, by the first sub-circuitry, from the initial test signal the noise signal having an amplitude larger than an amplitude of the first reference signal, to obtain the target test signal.

12. The method according to claim 11, wherein the signal shaping sub-circuitry further comprises:

a second reference signal input end configured to input a second reference signal;

a second sub-circuitry, coupled to the test signal input end, the corresponding signal output port and the second reference signal input end;

wherein the removing, by the signal shaping circuitry, the noise signal from the initial test signal, to obtain the target test signal further comprises:

removing, by the second sub-circuitry, from the initial test signal the noise signal having an amplitude smaller than an amplitude of the second reference signal, to obtain the target test signal.

13. A test system, comprising the test circuitry according to claim 1, wherein the signal output end of the test circuitry is configured to output a target test signal to a product to be tested.

* * * * *